(12) United States Patent
Ashizawa

(10) Patent No.: US 7,292,493 B1
(45) Date of Patent: Nov. 6, 2007

(54) SEMICONDUCTOR DEVICE WITH ELECTRICALLY BROKEN FUSE AND ITS MANUFACTURE METHOD

(75) Inventor: Tetsuo Ashizawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/495,768

(22) Filed: Jul. 31, 2006

(30) Foreign Application Priority Data

Jan. 24, 2006 (JP) ............................. 2006-014982

(51) Int. Cl.
*G11C 17/18* (2006.01)
(52) U.S. Cl. ..................... 365/225.7; 365/63; 365/226
(58) Field of Classification Search ................. 365/63, 365/225.7, 189.01, 226
See application file for complete search history.

(56) References Cited

U.S. PATENT DOCUMENTS 5,455,490 A * 10/1995 Callahan et al. ............. 315/194
5,672,941 A *  9/1997 Callahan et al. ............. 315/194

FOREIGN PATENT DOCUMENTS

JP          59-66142 A      4/1984

OTHER PUBLICATIONS

Norman J. Rohrer et al., "PowerPC 970 in 130nm and 90nm Technologies", ISSCC 2004, Session 3, Processors, 3.7.
Translation of International Preliminary Report on Patentability mailed Nov. 23, 2006, of International Application No. PCT/JP2005/002185.

* cited by examiner

*Primary Examiner*—Gene N. Auduong
(74) *Attorney, Agent, or Firm*—Westerman, Hattori, Daniels & Adrian, LLP.

(57) ABSTRACT

An electric fuse is formed over a semiconductor substrate, the electric fuse being broken when a current flows therethrough. A breaker transistor is formed in a first surface layer of the semiconductor substrate of a first conductivity type, the breaker transistor including a source region, a drain region and a gate electrode. The source and drain regions sandwiches a channel region. The gate electrode controls a conduction state between the source and drain regions. The drain region is connected to one end of the electric fuse. A breaker pad is connected to the end of the electric fuse to supply a fusing current to the electric fuse. A back-bias pad applies a fixed voltage to the first surface layer independently from both a power supply voltage and a ground potential. A fuse information read circuit reads a breakdown/non-breakdown state of the electric fuse.

10 Claims, 10 Drawing Sheets

US 7,292,493 B1

SEMICONDUCTOR DEVICE WITH ELECTRICALLY BROKEN FUSE AND ITS MANUFACTURE METHOD

CROSS REFERENCE TO RELATED APPLICATION

This application is based on and claims priority of Japanese Patent Application No. 2006-014982 filed on Jan. 24, 2006, the entire contents of which are incorporated herein by reference.

BACKGROUND OF THE INVENTION

A) Field of the Invention

The present invention relates to a semiconductor device and its manufacture method, and more particularly to a semiconductor device having electric fuses to be electrically broken.

B) Description of the Related Art

Electric fuses formed on a semiconductor substrate are used for redundancy of RAM and identification of chip IDs. An electric fuse is broken by applying large current thereto and generating electromigration. An electric fuse is characterized by a smaller occupying area than that of a fuse to be broken by laser irradiation. A fuse to be broken by laser appropriates all wiring layers for its own use, whereas an electric fuse uses only one wiring layer. The electric fuse causes a high degree of freedom in layout. Test, break, and break check can be performed by using a tester. Therefore, as compared to break by laser, a test cost can be reduced. The electric fuse can be broken even after packaging.

FIG. 9 is an equivalent circuit of an electric fuse and its breaker circuit adopted in a conventional semiconductor integrated circuit. A similar breaker circuit is disclosed in ISSCC 2004 3.7 Power PC 970 in 130 nm and 90 nm Technologies.

One terminal of an electric fuse 1 is connected to the drain region of a breaker transistor T1. The source region of the breaker transistor T1 is grounded. The other terminal of the electric fuse 1 is connected to a breaker pad 2. The terminal connected to the breaker pad 2 is grounded via a first read transistor T2. The terminal of the electric fuse 1 connected to the breaker transistor T1 is connected to a fuse information read circuit 8 via a second read transistor T3. The breaker transistor T1, first read transistor T2 and second read transistor T3 respectively connected directly to the electric fuse 1 consists of high breakdown voltage transistors capable of being durable for high voltage during breaking the fuse. A ground potential $V_{SS}$ is applied to a p-type well in which the breaker transistor T1 and read transistors T2 and T3 are disposed.

When the electric fuse 1 is to be broken, the read transistors T2 and T3 are turned off and the breaker transistor T1 is turned on to apply a fusing current to a serial circuit of the electric fuse 1 and breaker transistor T1 from the breaker pad 2. For reading whether the electric fuse 1 is a breakdown state or a non-breakdown state, the read transistors T2 and T3 are turned on and the breaker transistor T1 is turned off. The fuse information read circuit 8 reads the state of the electric fuse 1 and outputs a read result to an output terminal VF.

FIG. 10 shows a breaker circuit of an electric fuse disclosed in JP-A-SHO 59-66142. A pad 71 is connected to one terminal of a serial circuit of an electric fuse 75 and a breaker transistor TR1 on the side of the electric fuse 75, and the source region of the breaker transistor TR1 is grounded. A substrate potential of the breaker transistor TR1 is supplied from a pad 70 having the same potential as that of the semiconductor substrate.

An electronic circuit 72 is formed on the same substrate. The electronic circuit 72 includes an NMOS transistor TR2. The substrate potential of the NMOS transistor TR2 is also applied from the pad 70. An interconnection point between the electric fuse 75 and pad 71 is connected to the gate electrode of the NMOS transistor TR2.

When the electric fuse 75 is to be broken, the breaker transistor TR1 is turned on and a power supply voltage is applied to the pad 71 to apply a fusing current to the electric fuse 75. In order to confirm the state of the electric fuse 75 after it is broken, the pad 70 is maintained at a lower potential than that of the pad 71. If the electric fuse 75 is not broken, a forward current flows across a pn-junction between the diffusion layer of the breaker transistor TR1 and the semiconductor substrate. If the electric fuse 75 is broken, this forward current will not flow.

If the pad 71 is connected to the source or drain region of the NMOS transistor in the electronic circuit 72, a forward current flows across the pn-junction between the diffusion layer of the NMOS transistor and the semiconductor substrate while the breakdown state of the electric fuse 75 is confirmed. It is not possible therefore to confirm the breakdown state of the electric fuse 75. In the circuit shown in FIG. 10, since the pad 71 is connected only to the gate electrode of the NMOS transistor TR2 in the electronic circuit 72, current will not flow from the pad 70 to the pad 71 via the NMOS transistor in the electronic circuit 72.

SUMMARY OF THE INVENTION

It is necessary to apply a large current to an electric fuse when the fuse is to be broken. It is therefore necessary to widen the gate width of a breaker transistor serially connected to the electric fuse. As the gate width of a transistor is widened, a standby current increases. Since a large number of electric fuses are fabricated in a chip, the area occupied by breaker transistors is broadened and a consumption power increases.

An object of the present invention is to provide a semiconductor device and its manufacture method capable of suppressing an increase in the area occupied by breaker transistors for breaking electric fuses and an increase in standby current.

According to one aspect of the present invention, there is provided a semiconductor device comprising:

a first electric fuse formed over a semiconductor substrate, the first electric fuse being broken when a current flows therethrough;

a first breaker transistor including a source region, a drain region and a gate electrode, the source region and the drain region being disposed in a first surface layer of the semiconductor substrate of a first conductivity type and sandwiching a channel region, the gate electrode controlling a conduction state between the source and drain regions, the drain region being connected to one end of the first electric fuse;

a breaker pad connected to another end of the first electric fuse for supplying a fusing current to the first electric fuse;

a back-bias pad capable of applying a fixed voltage to the first surface layer independently from both a power supply voltage and a ground potential; and a first fuse information read circuit for reading a breakdown/non-breakdown state of the first electric fuse.

According to another aspect of the present invention, there is provided a manufacture method for a semiconductor device comprising:

an electric fuse formed on a semiconductor substrate, the first electric fuse being broken when a current flows therethrough; and a breaker transistor including a source region, a drain region and a gate electrode, the source region and the drain region being disposed in a first surface layer of the semiconductor substrate of a first conductivity type and sandwiching a channel region, the gate electrode controlling a conduction state between the source and drain regions, the drain region being connected to one end of the electric fuse, and the manufacture method comprising a step of:

applying a back-bias to the first surface layer so that a forward voltage is applied across a pn-junction between the first surface layer and the source region, applying a gate voltage to the gate electrode so that the breaker transistor turns on, and in this state, applying a fusing current to a serial circuit of the electric fuse and the breaker transistor to break the electric fuse.

As compared to the case in which a back-bias is not applied, a larger current can be applied to the breaker transistor by applying a back-bias to the first surface layer. Even if the gate width of the breaker transistor is narrowed, a large current sufficient for breaking the electric fuse can be applied. It is therefore possible to reduce an area occupied by the breaker transistor and a leak current in the off-state.

DESCRIPTION OF THE PREFERRED EMBODIMENTS

Figure 1A:
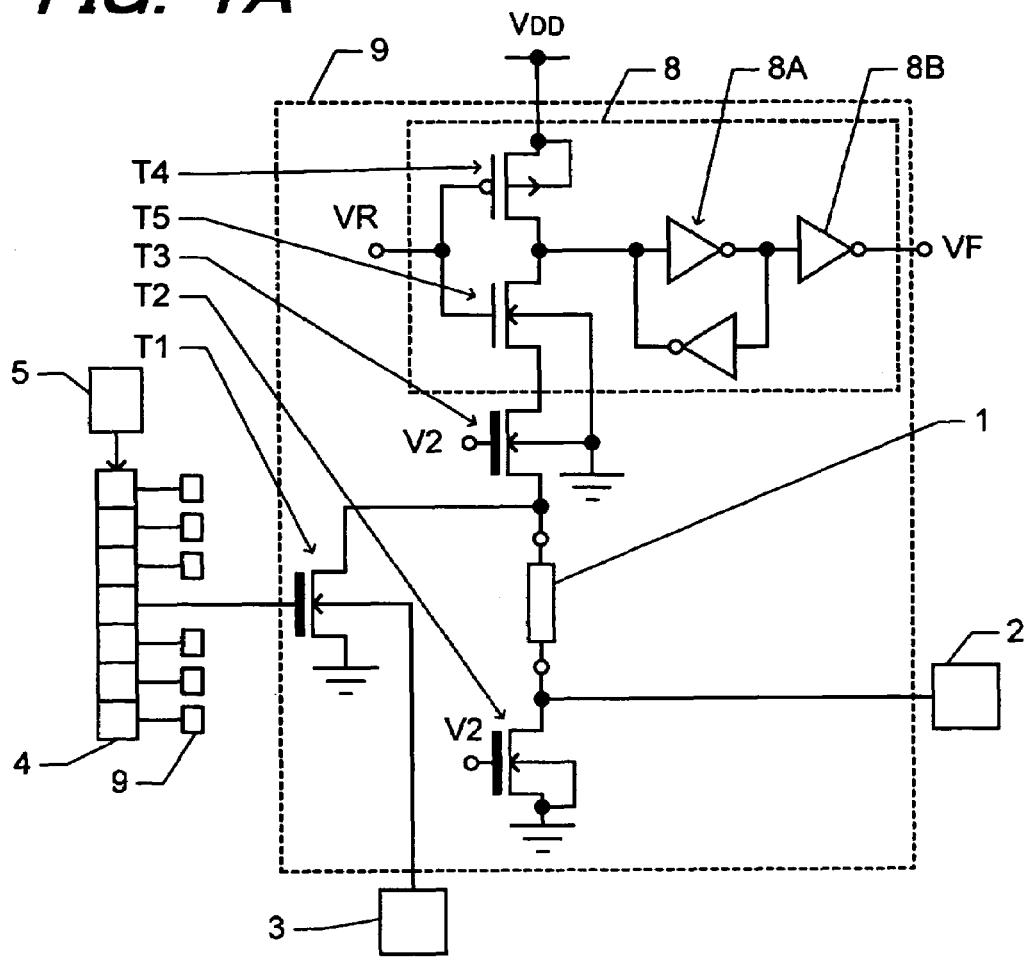
FIG. 1A is an equivalent circuit diagram of a semiconductor device according to a first embodiment.

FIG. 1A is an equivalent circuit diagram of a semiconductor device according to the first embodiment. The semiconductor device of the first embodiment is constituted of a plurality of, e.g., seven fuse blocks 9, a breakdown fuse selection register 4 and a selection information input circuit 5. The plurality of fuse blocks 9 has the same structure. The structure of one fuse block 9 will be described.

One terminal of an electric fuse 1 is connected to the drain region of an n-channel breaker transistor T1. The electric fuse 1 can be broken by applying a current to the electric fuse 1 larger than a threshold current. The source region of the breaker transistor T1 is grounded. A back-bias pad 3 applies a back-bias to a p-type well in which the breaker transistor T1 is disposed. A wiring interconnecting the back-bias pad and p-type well is electrically separated from both a ground line applied with a ground potential and a power supply line applied with a power supply voltage, and the back-bias can be applied to the p-type well independently from the ground potential and power supply voltage.

The terminal of the electric fuse 1 not connected to the breaker transistor T1 is connected to a breaker pad 2 and the drain region of an n-channel first read transistor T2. The source region of the first read transistor T2 is grounded. The terminal of the electric fuse 1 connected to the breaker transistor T1 is connected to the source region of an n-channel second read transistor T3. The drain region of the second read transistor T3 is connected to a fuse information read circuit 8.

The structure of the fuse information reading circuit 8 will be described. A serial circuit of a PMOS transistor T4 and an NMOS transistor T5 is connected between a power supply voltage $V_{DD}$ and the second read transistor T3. A reset signal VR is applied to the gate electrodes of the PMOS transistor T4 and NMOS transistor T5.

A potential at an interconnection point between the PMOS transistor T4 and NMOS transistor T5 is latched by a latch circuit 8A. Information at an output terminal of the latch circuit 8A is output to an output terminal VF of the fuse information read circuit 8 via an inverter 8B.

A ground potential $V_{SS}$ is applied to a p-type well in which the first and second read transistors T2 and T3 and the NMOS transistor T5 of the fuse information read circuit 8 are disposed. The power supply voltage $V_{DD}$ is applied to an n-type well in which the PMOS transistor T4 of the fuse information read circuit 8 is disposed.

One fuse block 9 is constituted of the electric fuse 1, breaker transistor T1, first and second read transistors T2 and T3 and fuse information read circuit 8.

The breakdown fuse selection register 4 has the same number of bits as that of fuse blocks 9. Breakdown information is input from the breakdown information input circuit 5 to the breakdown fuse selection register 4. Information stored at each bit of the breakdown fuse selection register 4 is supplied to the gate electrode of the breaker transistor T1 of the corresponding fuse block 9. A control voltage V2 is applied via a pad to the gate electrodes of the first and second read transistors T2 and T3.

Figure 1B:
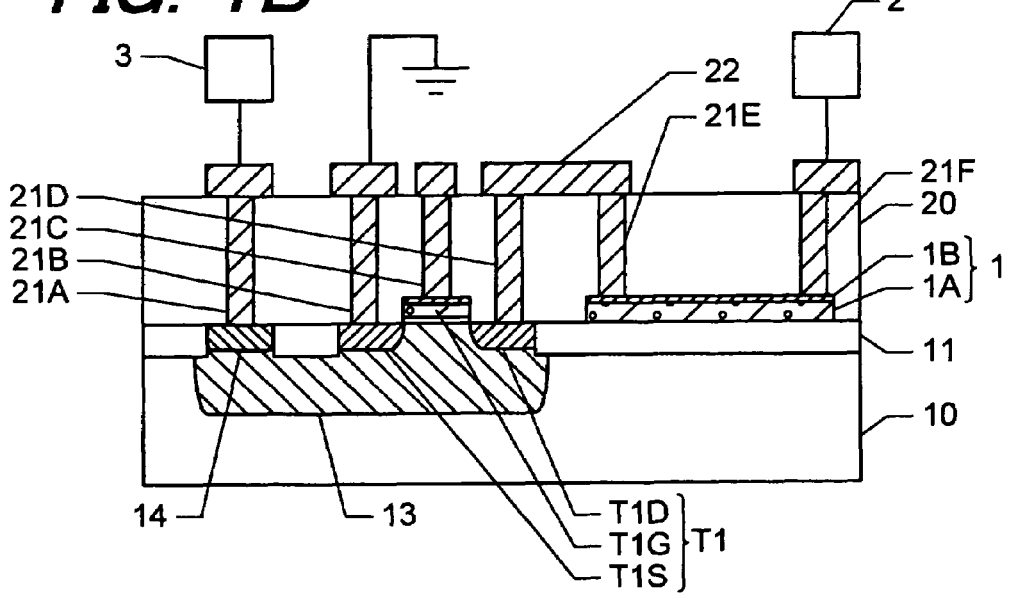
FIG. 1B is a cross sectional view showing the main portion of the semiconductor device.

FIG. 1B is a cross sectional view showing the main portion of the semiconductor device in which the electric fuse 1 and breaker transistor T1 are disposed. A p-type well 13 and an isolation insulating film 11 are formed in a surface layer of a semiconductor substrate 10 made of p-type silicon. The isolation insulating film 11 defines two active regions in the surface layer of the p-type well 13. The breaker transistor T1 is formed in one active region. The breaker transistor T1 comprises a source region T1S and a drain region T1D formed in the surface layer of the p-type well and sandwiching a channel region, and a gate electrode T1G for controlling a conduction state between the source and drain regions. A back-bias well contact 14 of a p⁺-type impurity diffusion region is formed in the other active region.

The electric fuse 1 is formed on the isolation insulating film 11. For example, the electric fuse 1 has a two-layer structure of a polysilicon film 1A and a cobalt silicide film 1B formed thereon. For example, a length of the electric fuse 1 is 1 μm, a width thereof is 0.1 μm, and a total thickness of the polysilicon film 1A and cobalt silicide film 1B is 0.1 μm.

An interlayer insulating film 20 is formed covering the electric fuse 1 and breaker transistor T1. Plugs 21A to 21F made of tungsten fills via holes formed in the interlayer insulating film 20. The plug 21A is connected to the back-bias well contact 14. The plugs 21B, 21C and 21D are connected to the source region T1S, gate electrode T1G and drain region T1D of the breaker transistor T1, respectively. The plug 21E is connected to one end of the electric fuse 1, and the plug 21F is connected to the other end of the electric fuse 1.

A wiring 22 formed on the electric fuse 20 interconnects the plugs 21D and 21E. One end of the electric fuse 1 is therefore connected to the drain region T1D of the breaker transistor T1.

A multilayer wiring layer is formed on the interlayer insulating film 20. The breaker pad 2 and back-bias pad 3 are formed on the uppermost interlayer insulating film. The breaker pad 2 is connected to the electric fuse 1 via the plug 21F. The back-bias pad 3 is connected to the back-bias well contact 14 via the plug 21A. The source region T1S is connected to the ground potential $V_{SS}$ via the plug 21B.

In FIG. 1B, although the breaker transistor T1 is disposed in the p-type well 13, it is not necessary to form this p-type well if a p-type substrate is used, and the breaker transistor T1 may be formed in a p-type surface layer of the substrate 10. In this case, the back-bias well contact 14 is disposed in another region of the p-type surface layer in which the breaker transistor T1 is disposed.

Figure 2:
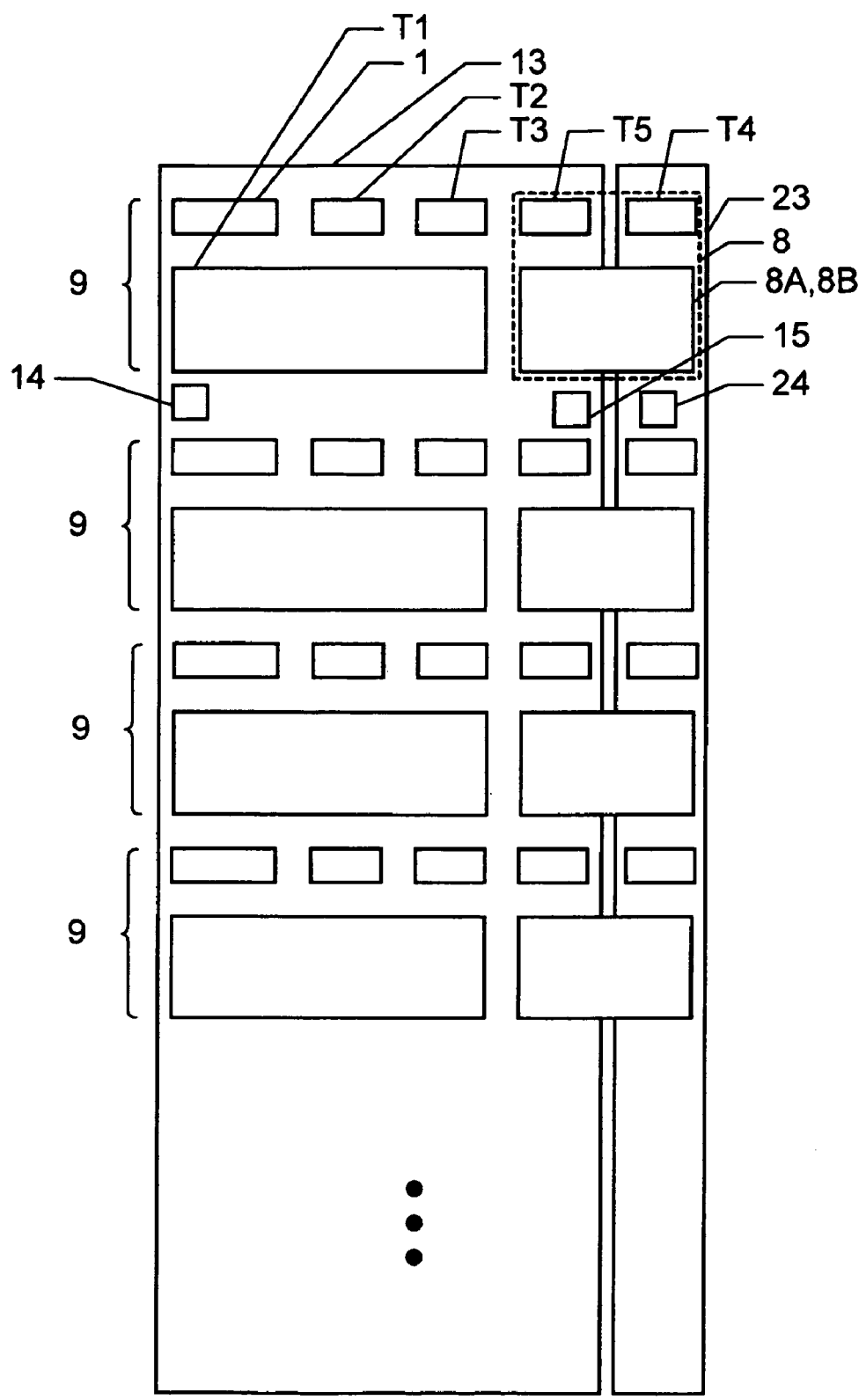
FIG. 2 is a plan view showing the layout of components of the semiconductor device of the first embodiment.

FIG. 2 shows an example of the layout of the semiconductor device of the first embodiment. The p-type well 13 extends vertically in FIG. 2. An n-type well 23 extends in parallel with the p-type well 13. A plurality of fuse blocks 9 are disposed along the longitudinal direction of the p-type well 13 and n-type well 23, and each fuse block 9 is placed across both of the p-type well 13 and n-type well 23. The layout of components in each fuse block 9 is congruent for all fuse blocks 9. In the following, the layout of components in one fuse block 9 will be described.

The breaker transistor T1, first and second read transistors T2 and T3 and the NMOS transistor T5 of the fuse state read circuit 8 are disposed in the p-type well 13. The electric fuse 1 is disposed on the isolation insulating film covering the upper surface of the p-type well 13. The PMOS transistor T4 of the fuse state read circuit 8 is disposed in the n-type well 23. MOS transistors constituting the latch circuit 8A and inverter 8B of the fuse state read circuit 8 are disposed in the p-type well 13 and n-type well 23.

The back-bias well contact 14 is disposed in the p-type well 13 at a position near the breaker transistor T1. A $V_{SS}$ well contact 15 is disposed in the p-type well 13 at a position different from that of the back-bias well contact 14. For example, the $V_{SS}$ well contact 15 is disposed near the fuse information read circuit 8. A $V_{DD}$ well contact 24 is disposed in the n-type well 23 at a position near the fuse information read circuit 8.

Next, description will be made on a method of breaking the electric fuse 1 of the semiconductor device according to the first embodiment.

A back-bias is applied to the p-type well 13 so that a forward voltage is applied to an interface between the p-type well 13 and the source region T1S of the breaker transistor T1. This back-bias is supplied from the back-bias pad 3. A gate voltage is applied to the gate electrode T1G to turn on the breaker transistor T1. This gate voltage is applied by setting the corresponding bit of the breakdown fuse selection register 4 shown in FIG. 1A. The first and second read transistors T2 and T3 are turned off by setting a low level to the control voltage V2 applied to the gate electrodes of the first and second read transistors T2 and T3. In this state, a breaker voltage is applied to the breaker pad 2 to apply a fusing current to the electric fuse 1.

For example, the power supply voltage $V_{DD}$ is 1.0 to 1.2 V, a voltage applied to the breaker pad 2 is 3.3 V, a back-bias applied to the back-bias pad 3 is 0.5 V. It is preferable to set the back-bias lower than the threshold voltage at which the forward current of a pn-junction diode formed between the p-type well 13 and source region T1S rises. By setting the back-bias lower than the threshold voltage, it is possible to prevent an abrupt increase in the forward current flowing from the back-bias pad 3 to the ground potential.

As the back-bias of about 0.5 V is applied to the breaker transistor T1, a current flowing through the breaker transistor T1 increases by about 20% as compared to the current flowing when the p-type well 13 is grounded (i.e., when the back-bias is set to 0 V). Namely, even if the gate width of the breaker transistor T1 is narrowed by about 20%, the fusing current of about the same degree as that when the back-bias is not applied can flow by applying the back-bias. For example, if it is necessary to set the gate width of the breaker transistor T1 to 10 to 20 μm in the conventional configuration not applying the back-bias, it is possible to set the gate width to 8 to 16 μm in the first embodiment.

By narrowing the gate width, an area occupied by the breaker transistor T1 can be reduced. Further, it is possible to reduce a leak current in an off-state of the breaker transistor T1.

During the operation of the semiconductor device of the first embodiment, the back-bias pad 3 is made in an open state.

Next, description will be made on a method of reading a breakdown/non-breakdown state of the electric fuse 1. During the operation of the semiconductor device, the breaker transistor T1 is turned off and the first and second read transistors T2 and T3 are turned on. As the reset signal VR is set to the L level when the power supply is activated, the output terminal VF takes the H level. The reset signal VR is set to the H level after the power supply is activated perfectly. The output terminal VF remains at the H level when the electric fuse 1 was broken, whereas the output terminal VF takes the L level when the electric fuse 1 was not broken.

As the back-bias of about 0.5 V is applied to the back-bias well contact 14 shown in FIG. 2 while the electric fuse 1 is to be broken, a through current flows from the back-bias well contact 14 toward the $V_{SS}$ well contact 15. This through current flows only during the period while the fusing current is flowing through the electric fuse 1. Since the back-bias pad 3 is made in the open state during the operation of the semiconductor device, the through current will not flow. Any problem does not occur therefore in the operation of the semiconductor device. During the operation, the ground potential $V_{SS}$ may be applied to the back-bias pad 3. In order to make the through current flowing while the electric fuse 1 is to be broken, as small as possible, it is preferable to keep the back-bias well contact 14 as far away from the $V_{SS}$ well contact 15 as possible.

Figure 3:
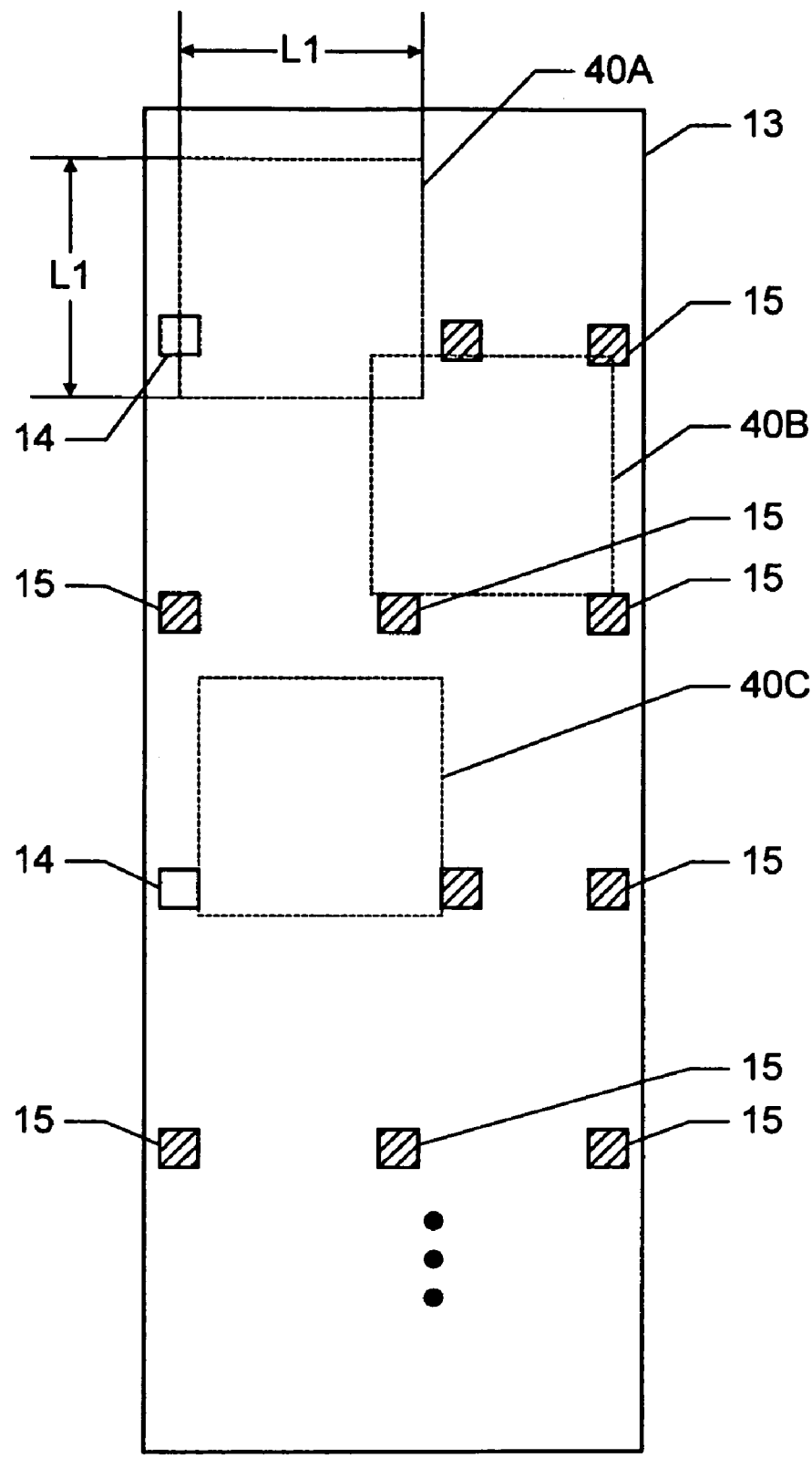
FIG. 3 is a plan view showing an example of the layout of well contacts of the semiconductor device of the first embodiment.

FIG. 3 shows an example of the layout of well contacts. In FIG. 3, back-bias well contacts 14 are represented by a white square, and $V_{SS}$ well contacts 15 are represented by a hatched square. In order to make uniform the potential in a well, it is generally preferable to distribute well contacts uniformly in the well. For example, when defining a unit area having a side length of L1, well contacts are disposed in such a manner that a unit area is superposed on or contacts at least one well contact no matter where the unit area is disposed in the well. It is generally allowed to dispose two well contacts at a distance narrower than the length L1. The length L1 is, for example, 20 μm.

If the back-bias well contact 14 and $V_{SS}$ well contact 15 are disposed too near, the through current flowing while the electric fuse 1 is to be broken becomes large. In order to suppress an increase in the through current, it is preferable to forbid that the back-bias well contact 14 and $V_{SS}$ well contact 15 are disposed at a distance shorter than the length L1. This condition is called a "forbidden condition".

In FIG. 3, no matter where the unit area of a square having a side length of L1 is disposed in the p-type well 13, the unit area is superposed on or contacts at least one back-bias well contact 14 or $V_{SS}$ well contact 15. For example, a unit area 40A superposes upon one back-bias well contact 14. A unit area 40B superposes upon two $V_{SS}$ well contacts 15 and is in contact with two $V_{SS}$ well contacts 15. A unit area 40C is in contact with one back-bias well contact 14 and one $V_{SS}$ well contact 15.

It is permitted that $V_{SS}$ well contacts 15 are disposed at a distance shorter than the length L1. In contrast, a distance between the back-bias well contact 14 and the nearest $V_{SS}$ well contact 15 is at least L1, and the $V_{SS}$ well contact 15 is not disposed at a position nearer than that, satisfying the above-described forbidden condition.

Even if a distance between back-bias well contacts 14 is set shorter than the length L1, an increase in the through current is not caused.

Figure 4:
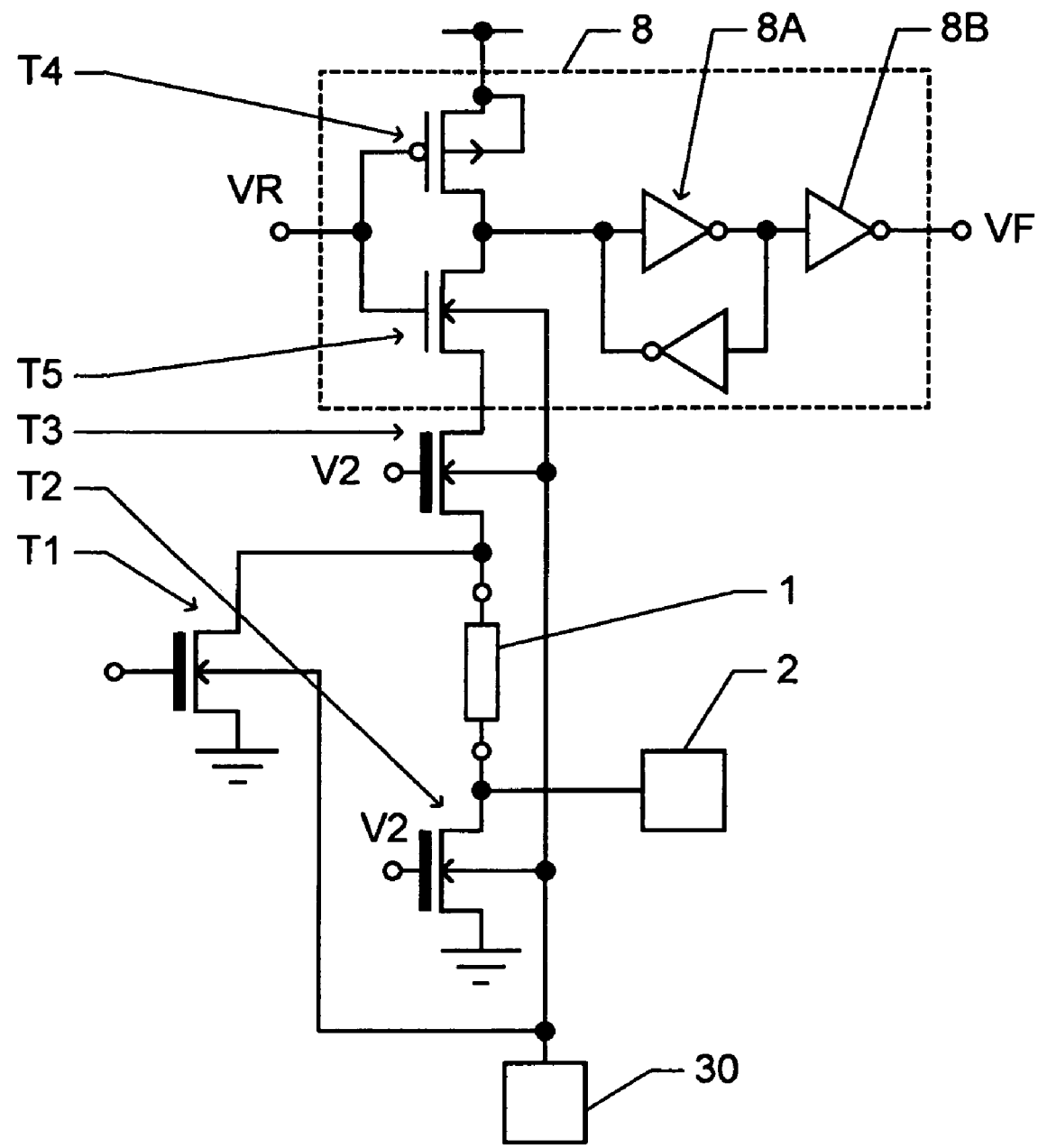
FIG. 4 is an equivalent circuit diagram of a semiconductor device according to a second embodiment.

FIG. 4 is an equivalent circuit diagram of a semiconductor device of the second embodiment. Description will be made by paying attention to different points from the semiconductor device of the first embodiment shown in FIG. 1A. Description is omitted for components having the same structure as that of the semiconductor device of the first embodiment.

In the first embodiment, the source region of the first read transistor T2 is connected to the p-type well in which the transistor T2 is disposed, and the ground potential is applied to both the source region and p-type well. In the second embodiment, the potential of the p-type well, in which a breaker transistor T1, first and second read transistors T2 and T3, and an NMOS transistor T5 of a fuse information read circuit 8 are disposed, is controlled independently from the ground potential. Instead of the back-bias pad 3 of the first embodiment, a p-type well potential pad 30 applies a fixed potential to the p-type well.

By applying a back-bias of about 0.5 V to the p-type well while an electric fuse 1 is to be broken, a large current can be applied to the breaker transistor T1 as in the case of the first embodiment. It is necessary for the gate electrodes of the first and second read transistors T2 and T3 to be applied with a gate voltage sufficient for maintaining the read transistors in an off-state even while the back-bias is applied.

During the operation of the semiconductor device, a ground potential is applied to the p-type well pad 30. A fixed potential different from the ground potential may be applied in order to adjust the operation performance of NMOS transistors in the p-type wall.

Figure 5A:
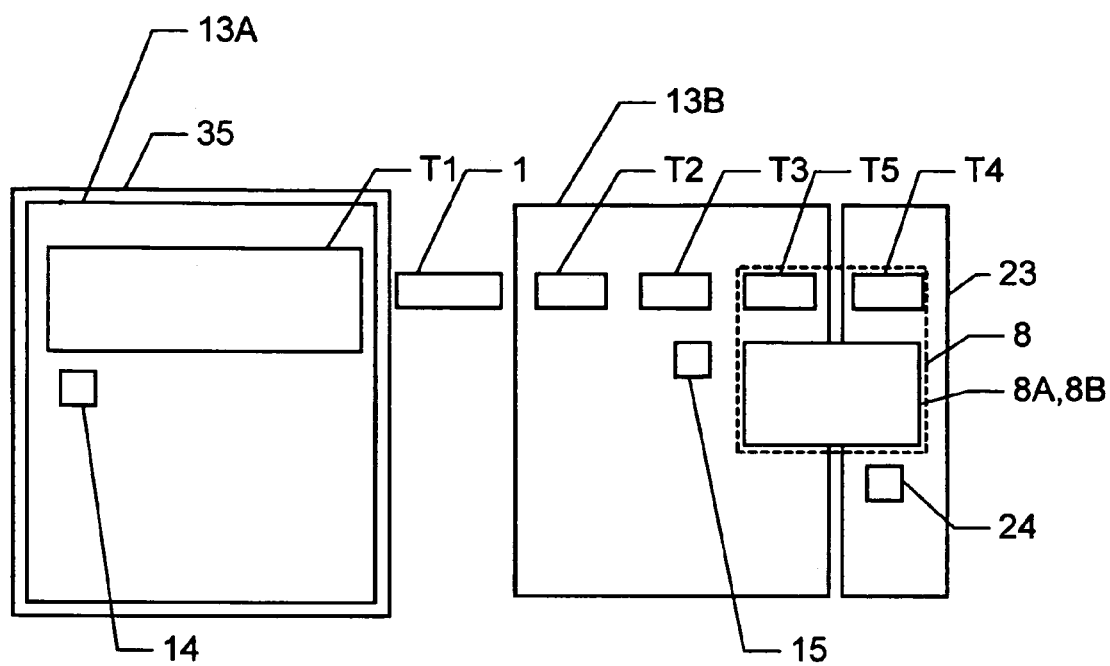
FIG. 5A is a plan view showing the layout of components of a semiconductor device according to a third embodiment.

FIG. 5A shows the layout of each component of a semiconductor device according to the third embodiment. An equivalent circuit of the semiconductor device of the third embodiment is the same as that of the first semiconductor device shown in FIG. 1A. Description will be made by paying attention to different points from the layout of each component of the semiconductor device of the first embodiment shown in FIG. 2. Description is omitted for components having the same structure as that of the semiconductor device of the first embodiment.

In the first embodiment, as shown in FIG. 2 the breaker transistor T1 is disposed in the p-type well 13 common to other NMOS transistors in the fuse block 9. In the third embodiment, a breaker transistor T1 is disposed in a breaker transistor well 13A different from a p-type well 13B in which other NOMS transistors are disposed. A back-bias well contact 14 is disposed in the breaker transistor well 13A. The breaker transistor well 13A is disposed in a deep n-type well 35.

Figure 5B:
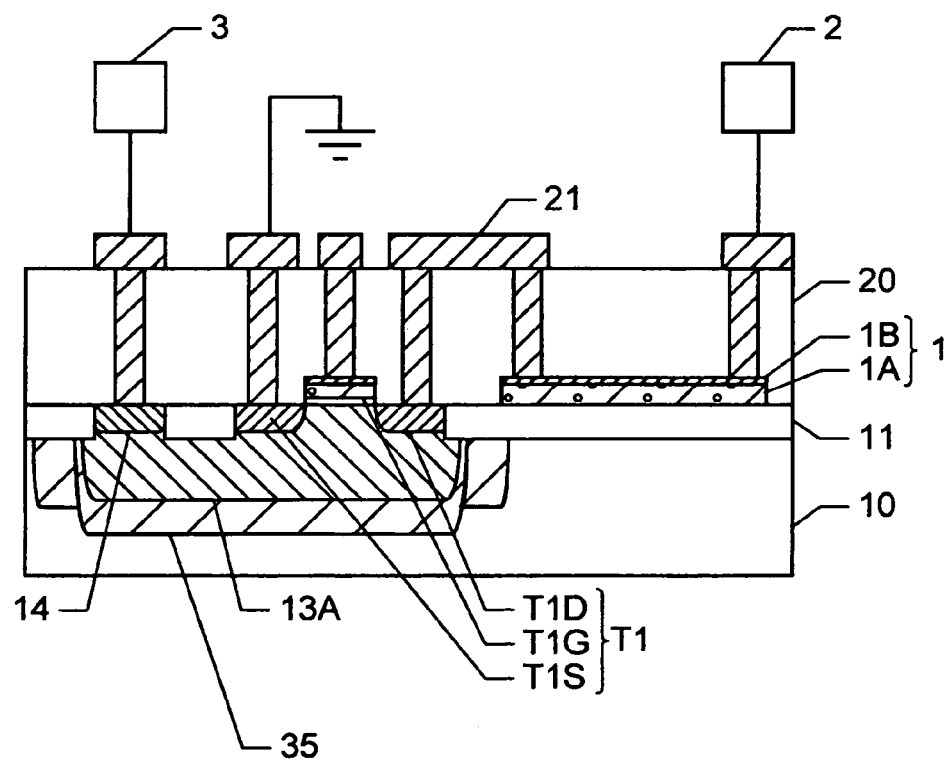
FIG. 5B is a cross sectional view showing the main portion of the semiconductor device.

FIG. 5B is a cross sectional view of the breaker transistor 1 and breaker transistor well 13A. The breaker transistor well 13A is disposed in the n-type well 35 deeper than the breaker transistor well 13A, providing a so-called triple well structure. The back-bias well contact 14 is formed in the surface layer of the breaker transistor well 13A. A back-bias is applied to the breaker transistor well 13A from the back-bias pad 3 via the back-bias well contact 14.

Since the breaker transistor well 13A is disposed in the deeper n-type well 35, the breaker transistor well 13A is electrically isolated from the p-type well 13B in which other NMOS transistors T2, T3 and T5 are disposed.

When the electric fuse 1 is to be broken, a back-bias is applied to the breaker transistor well 13A from the back-bias pad 3 via the back-bias well contact 14. A ground potential is applied via the $V_{SS}$ well contact 15 to the p-type well 13B in which the other transistors T2, T3 and T5 are disposed.

In the first embodiment, while the fusing current is flowing through the electric fuse 1, a through current flows from the back-bias well contact 14 toward the $V_{SS}$ well contact 15 shown in FIG. 2. In the third embodiment, a through current will not flow while the electric fuse 1 is to be broken, because the breaker transistor well 13A in which the back-bias well contact 14 is disposed is electrically isolated from the p-type well 13B in which the $V_{SS}$ well contact 15 is disposed.

In the third embodiment, a ground potential is not applied to the breaker transistor well 13A from the $V_{SS}$ well contact 15. It is therefore preferable to apply a ground potential to the breaker transistor well 13A from the back-bias pad 3 during the operation of the semiconductor device.

Figure 6:
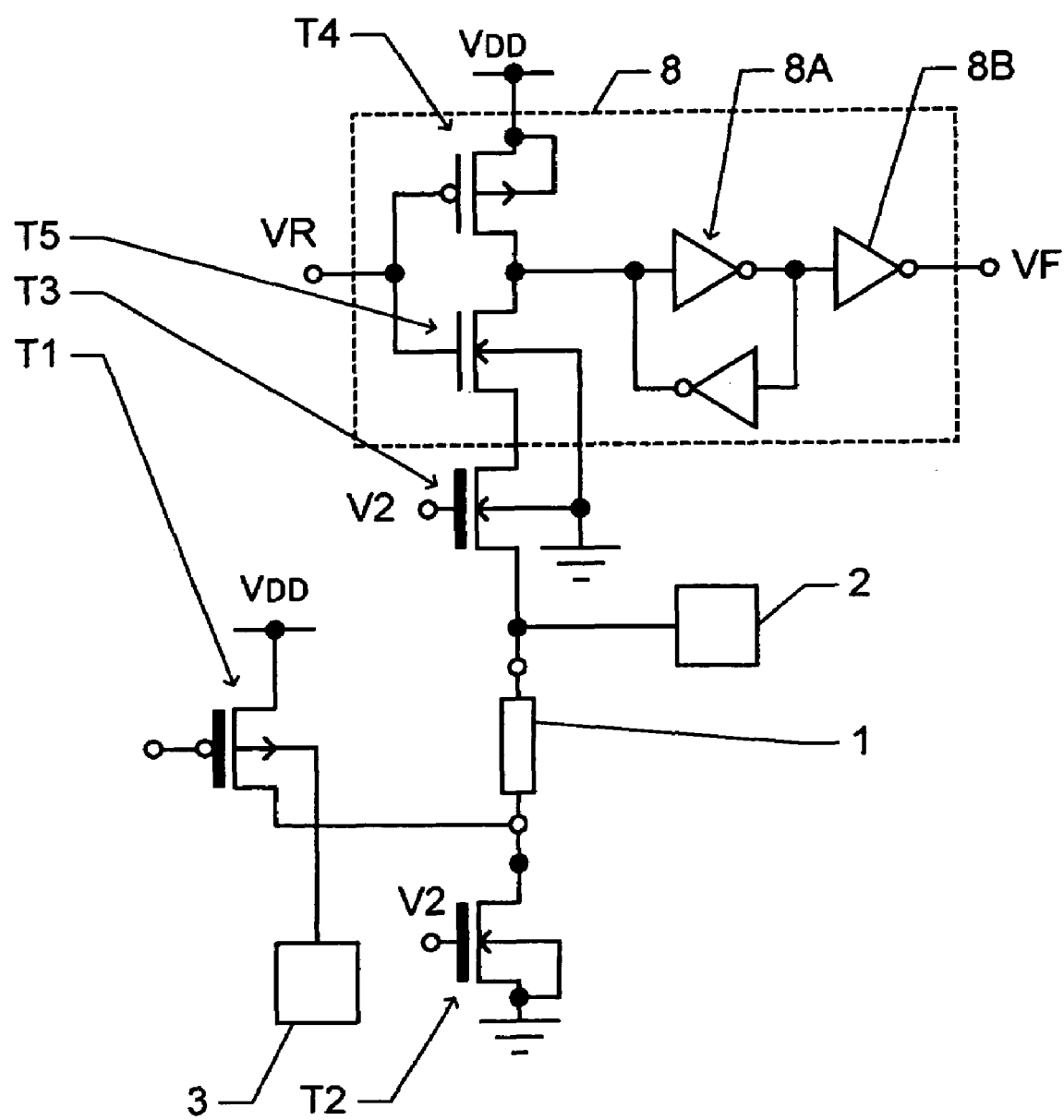
FIG. 6 is an equivalent circuit of a semiconductor device according to a fourth embodiment.

FIG. 6 is an equivalent circuit diagram of a semiconductor device of the fourth embodiment. Description will be made by paying attention to different points from the equivalent circuit of the semiconductor device of the first embodiment shown in FIG. 1A. Description is omitted for components having the same structure as that of the semiconductor device of the first embodiment.

In the first embodiment, the breaker transistor T1 consists of an NMOS transistor, whereas in the fourth embodiment, a breaker transistor consists of a PMOS transistor. In response to this different structure, a breaker pad 2 is connected to an interconnection point between an electric fuse 1 and a second read transistor T3, and the drain region of the breaker transistor T1 is connected to an interconnection point between the electric fuse 1 and a first read transistor T2. A power supply voltage $V_{DD}$ is applied to the source region of the breaker transistor T1.

Although the power supply voltage $V_{DD}$ is generally applied to an n-type well in which PMOS transistors are contained, a predetermined voltage is applied via a back-bias pad 3 to the n-type well contained the breaker transistor T1, independently from the power supply voltage $V_{DD}$. When the electric fuse 1 is to be broken, a back-bias is applied via the back-bias pad 3 to the n-type well containing the breaker transistor T1 so that a forward voltage is applied across a pn-junction between the source region and n-type well. The breaker pad 2 is grounded. The back-bias is preferably set to a voltage higher than a threshold voltage at which a forward current starts flowing across the pn-junction between the source region and n-type well, e.g., a voltage lower than the power supply voltage $V_{DD}$ by about 0.5 V.

A large current can flow by applying the back-bias to the breaker transistor T1. During the operation of the semiconductor device, the back-bias pad 3 may be made in an open state or the power supply voltage $V_{DD}$ may be applied to the back-bias pad 3.

Figure 7:
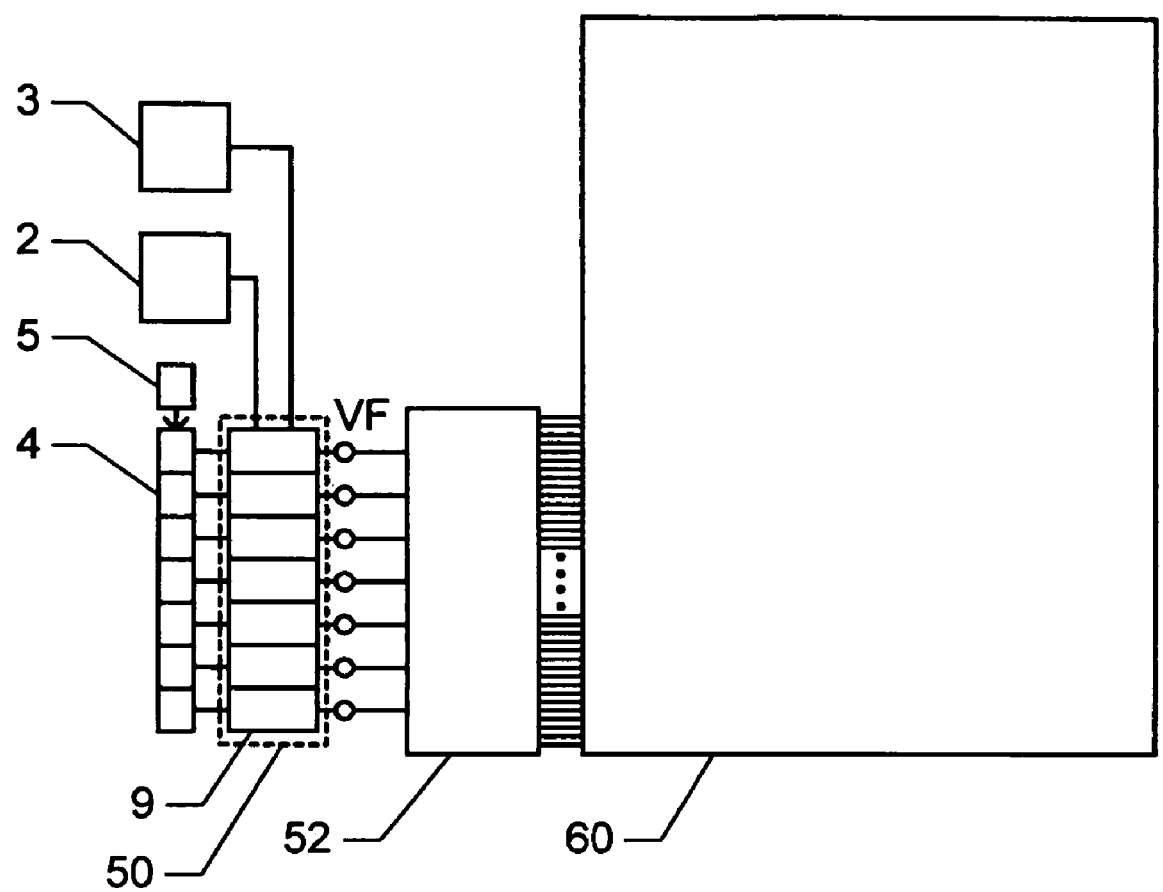
FIG. 7 is a block diagram of a semiconductor device according to a fifth embodiment.

FIG. 7 is a block diagram of a semiconductor device of the fifth embodiment. The semiconductor device of the fifth embodiment includes a redundancy information memory circuit 50, a decoder 52 and a RAM macro 60. The redundancy information memory circuit 50 includes seven fuse blocks 9. Each fuse block 9 has the same structure as that of the fuse block 9 of the semiconductor devices of the first to fourth embodiments.

A fusing current is supplied from a breaker pad 2 to each electric fuse 1 in the seven fuse blocks 9. A back-bias is applied from a back-bias pad 3 to each breaker transistor T1 in the seven fuse blocks 9.

A breakdown information input circuit 5 inputs breakdown information to a breakdown fuse selection register 4 of 7 bits. Information on each bit of the breakdown fuse selection register 4 is input to the gate electrode of the breaker transistor T1 in a corresponding fuse block 9. Each of the seven fuse blocks 9 outputs from an output terminal VF a signal representative of a breakdown/non-breakdown state of the electric fuse 1.

Fuse information output from the output terminal VF of the fuse block 9 is input to a decoder 52. The decoder 52 decodes the fuse information to generate a signal of 65 bits, and inputs the signal to the RAM macro 60.

The RAM macro 60 has a memory array of 64 bits and a redundancy array of 1 bit. One bit of 65 bits input from the decoder 52 represents whether redundancy is required or not. The remaining 64 bits identify the memory array having a detected defect and being replaced by the redundant circuit.

Figure 8:
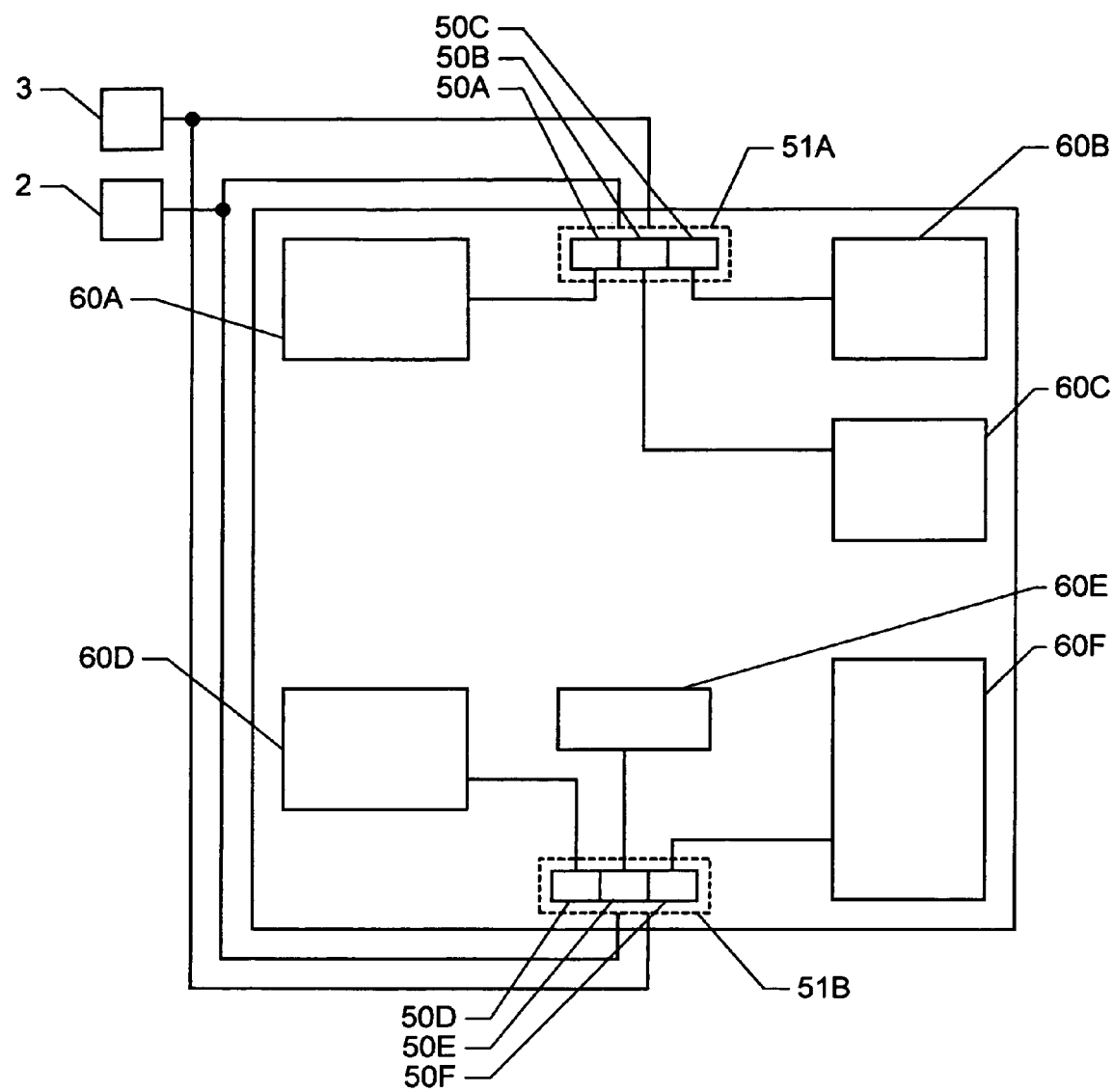
FIG. 8 is a plan view showing the layout in a chip of a semiconductor device according to a sixth embodiment.
Figure 9:
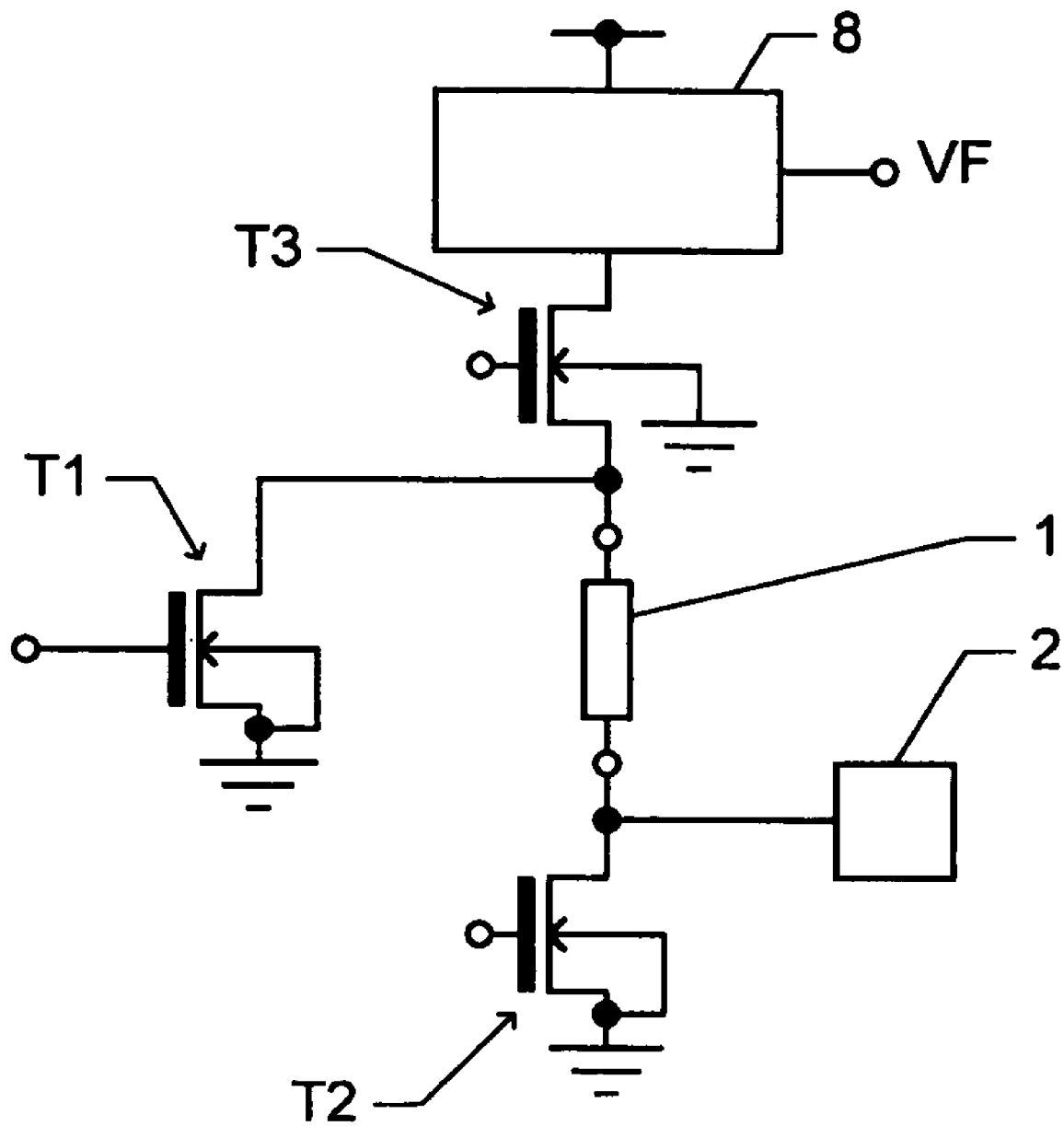
FIG. 9 is an equivalent circuit diagram of a conventional semiconductor device having an electric fuse.
Figure 10:
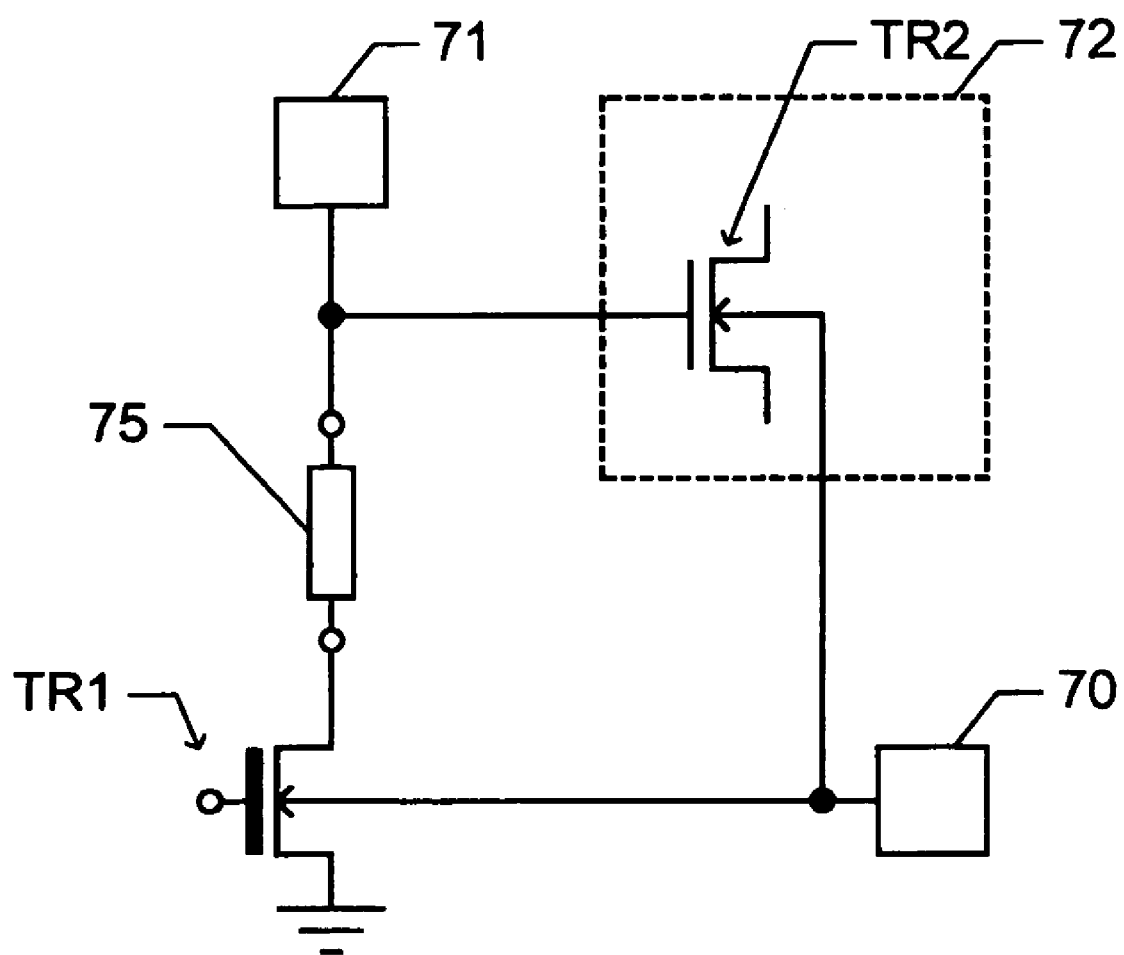
FIG. 10 is an equivalent circuit diagram of a conventional semiconductor device having an electric fuse.

FIG. 8 shows the layout in a chip of a semiconductor device according to the sixth embodiment. In the sixth embodiment, a plurality of RAM macros 60A to 60F is arranged in one chip. Redundancy information memory circuits 50A to 50C corresponding to the RAM macros 60A to 60C are concentrated in one area to constitute a redundancy information memory unit 51A. For example, the redundancy information memory circuits 50A and 50B are disposed adjacent to each other, and the redundancy information memory circuits 50B and 50C are disposed adjacent to each other. Redundancy information memory circuits 50D to 50F corresponding to the other RAM macros 60D to 60F are concentrated in one area to constitute a redundancy information memory unit 51B. A plurality of breaker transistors T1 in the other redundancy information memory unit 51A are disposed in one well. A plurality of breaker transistors T1 in the other redundancy information memory unit 51B are also disposed in one well. The decoder 52 shown in FIG. 7 may be disposed near the redundancy information memory unit or near the RAM macro.

A fusing current is supplied from a breaker pad 2 to electric fuses 1 in the redundancy information memory units 51A and 51B. A back-bias is applied from a back-bias pad 3 to breaker transistors T1 in the redundancy information memory units 51A and 51B. A larger fusing current flows through wirings interconnecting the breaker pad 2 and redundancy information memory units 51A and 51B, more than other wirings. These wirings are required to be thicker than other wirings. If the redundancy information memory circuits 50A to 50F are disposed near the RAM macros 60A to 60F, thick wirings are required to be extended longways in the chip. By concentrating the redundancy information memory circuits 50A to 50C corresponding to the RAM macros 60A to 60C in one area, a length of a thick wiring can be shortened and an area occupied by the wiring can be reduced.

The present invention has been described in connection with the preferred embodiments. The invention is not limited only to the above embodiments. It will be apparent to those skilled in the art that other various modifications, improvements, combinations, and the like can be made.

I claim:

1. A semiconductor device comprising:
a first electric fuse formed over a semiconductor substrate, the first electric fuse being broken when a current floes therethrough;
a first breaker transistor including a source region, a drain region and a gate electrode, the source region and the drain region being disposed in a first surface layer of the semiconductor substrate of a first conductivity type and sandwiching a channel region, the gate electrode controlling a conduction state between the source and drain regions, the drain region being connected to one end of the first electric fuse;
a breaker pad connected to another end of the first electric fuse for supplying a fusing current to the first electric fuse;
a back-bias pad capable of applying a fixed voltage to the first surface layer independently from both a power supply voltage and a ground potential; and
a first fuse information read circuit for reading a breakdown/non-breakdown state of the first electric fuse.

2. The semiconductor device according to claim 1, further comprising:
another first transistor disposed in the first surface layer;
a first well contact disposed in the first surface layer for applying a fixed potential to the first surface layer; and
a back-bias well contact disposed in the first surface layer and connected to the back-bias pad.

3. The semiconductor device according to claim 1, wherein:
a plurality of well contacts are distributed under a condition that as a unit area is defined as a standard size square, the unit area is superposed on or contacts at least one well contact no matter where the unit area is disposed in a well formed in a surface layer of the semiconductor substrate; and
under a condition that other well contacts for applying a same fixed potential as the fixed potential to be applied by the first well contact are disposed in the first surface layer wherein the other well contacts for applying the fixed potential are permitted to be disposed at a distance shorter than a side length of the unit area, and the back-bias well contact and the other well contacts are prohibited to be disposed at a distance shorter than the side length of the unit area, the back-bias well contact, the first well contact and the other well contacts are distributed.

4. The semiconductor device according to claim 1, further comprising:
a first read transistor for connecting one end of the first electric fuse to the ground potential;
a second read transistor for connecting another end of the first electric fuse to the first fuse information read circuit, the first surface layer containing the first breaker transistor consists of a first well;
a second well containing the first and second read transistors;
a back-bias well contact disposed in the first well and connected to the back-bias pad; and
a first well contact disposed in the second well for applying a fixed potential to the second well, the first and second wells being electrically isolated.

5. The semiconductor device according to claim 1, further comprising:
a plurality of other second electric fuses formed over the semiconductor substrate, the second electric fuse being broken when a current flows therethrough;
a second breaker transistor disposed in the first surface layer for each of the second electric fuses, the second breaker transistor including a source region, a drain region and a gate electrode, the source region and the drain region sandwiching a channel region, the gate electrode controlling a conduction state between the source and drain regions, the drain region being connected to one end of the corresponding second electric fuse; and
a second fuse information read circuit disposed for each second electric fuse for reading a breakdown/non-breakdown state of a corresponding second electric fuse,
wherein the breaker pad is connected to another end of the second electric fuse.

6. A semiconductor device comprising:
a first RAM macro disposed over a semiconductor substrate and having a redundancy structure;
a first redundancy information memory circuit for supplying redundancy retrieval information to the first RAM macro;
a breaker pad; and
a back-bias pad,
wherein:
the first redundancy information memory circuit includes a plurality of fuse blocks, each of the fuse blocks comprising:
an electric fuse formed over the semiconductor substrate, the electric fuse being broken when a current flows therethrough;
a breaker transistor disposed in a first surface layer of the semiconductor substrate of a first conductivity type for each electric fuse, the breaker transistor including a source region, a drain region and a gate electrode, the source region and the drain region sandwiching a channel region, the gate electrode controlling a conduction state between the source and drain regions, the drain region being connected to one end of the corresponding electric fuse; and
a fuse information read circuit disposed for each electric fuse for reading a breakdown/non-breakdown state of the corresponding electric fuse;
the breaker pad is connected to another end of the electric fuses for supplying a fusing current to the electric fuses; and
the back-bias pad being capable of applying a fixed voltage to the first surface layer independently from a power supply voltage and a ground potential.

7. The semiconductor device according to claim 6, further comprising:
at least one second RAM macro having a redundancy structure and disposed over the semiconductor substrate; and
a second redundancy information memory circuit for supplying redundancy retrieval information to the second RAM macro,
wherein the second redundancy information memory circuit includes a plurality of fuse blocks, each of the fuse blocks comprising:
an electric fuse formed over the semiconductor substrate, the electric fuse being broken when a current flows therethrough;
a breaker transistor disposed in the first surface layer of the semiconductor substrate of the first conductivity type for each electric fuse, the breaker transistor including a source region, a drain region a d a gate electrode, the source region and the drain region sandwiching a channel region, the gate electrode controlling a conduction state between the source and drain regions, the drain region being connected to one end of the electric fuse; and
a fuse information read circuit disposed for each electric fuse for reading a breakdown/non-breakdown state of the corresponding electric fuse, and
wherein the first and second redundancy information memory circuits are disposed adjacent to each other.

8. The semiconductor device according to claim 6, wherein the breaker transistors in the fuse blocks are disposed in a same well of the first conductivity type.

9. A manufacture method for a semiconductor device comprising:
an electric fuse formed on a semiconductor substrate, the first electric fuse being broken when a current flows therethrough; and
a breaker transistor including a source region, a drain region and a gate electrode, the source region and the drain region being disposed in a first surface layer of the semiconductor substrate of a first conductivity type and sandwiching a channel region, the gate electrode controlling a conduction state between the source and drain regions, the drain region being connected to one end of the electric fuse,
and the manufacture method comprising a step of:
applying a back-bias to the first surface layer so that a forward voltage is applied across a pn-junction between the first surface layer and the source region, applying a gate voltage to the gate electrode so that the breaker transistor turns on, and in this state, applying a fusing current to a serial circuit of the electric fuse and the breaker transistor to break the electric fuse.

10. The manufacture method for a semiconductor device according to claim 9, wherein a voltage applied across the pn-junction between the first surface layer and the source region by the back-bias is at most a threshold voltage, at which a forward current starts flowing across the pn-junction between the first surface layer and the source region.

* * * * *